(12) United States Patent  
Sarkees

(10) Patent No.: US 7,492,239 B1  
(45) Date of Patent: Feb. 17, 2009

(54) RADIO FREQUENCY COMBINER

(75) Inventor: George R. Sarkees, Pembroke Pines, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 11/872,735

(22) Filed: Oct. 16, 2007

(51) Int. Cl.
 *H01P 5/12* (2006.01)

(52) U.S. Cl. ............... 333/124; 333/100; 333/129; 333/132

(58) Field of Classification Search ............ 333/124, 333/100, 129, 132
 See application file for complete search history.

(56) References Cited

U.S. PATENT DOCUMENTS

| | | | | |
|---|---|---|---|---|
| 4,851,795 A | * | 7/1989 | Beckwith | 333/100 |
| 5,045,821 A | * | 9/1991 | Staudinger et al. | 333/118 |
| 5,430,418 A | * | 7/1995 | Blodgett | 333/100 |
| 5,469,129 A | * | 11/1995 | Dydyk | 333/124 |
| 5,939,939 A | * | 8/1999 | Gaynor et al. | 330/124 R |

* cited by examiner

*Primary Examiner*—Benny Lee  
*Assistant Examiner*—Kimberly E Glenn

(57) ABSTRACT

An electronic circuit, an RF signal power amplifier circuit, and an integrated circuit provide for combining two radio frequency signals. These circuits include, among other things, capacitors (276, 282) that provide an elliptic section. This elliptic section simultaneously allows for filtering and reduction in required values for first and second inductors (248, 272), respectively. For example, the filtering provided by the capacitors (276, 282) allows for the harmonic of the combining frequency to be filtered out. This allows a designer to compensate for additional loss experienced by the circuit (200) by reducing filtering from sections that follow the circuit (200).

20 Claims, 4 Drawing Sheets

RADIO FREQUENCY COMBINER

FIELD OF THE INVENTION

The present invention generally relates to the field of wireless communications, and more particularly relates to a radio frequency combiner for use in wireless communication systems.

BACKGROUND OF THE INVENTION

A combiner is an electrical circuit that can combine a plurality of signals into a single signal. Within wireless communication technologies a combiner can be used to combine two or more radio frequency ("RF") signals into a signal. However, conventional RF combiners have various problems and disadvantages when used within modern wireless communication technologies. For example, when combining RF signals at Very High Frequencies ("VHF"), conventional RF combiners require components with large values. For example, wireless communication technologies use inductors of values around 72 nH for VHF applications. Large inductances are difficult to implement if the circuits are to be low loss. Higher component values result in higher turns and greater losses. These values are too large to be implemented into modern wireless communication system components which more and more require miniaturization to accommodate consumer demands for smaller products.

Therefore a need exists to overcome the problems with the prior art as discussed above.

SUMMARY OF THE INVENTION

Briefly, in accordance with the present invention, disclosed are an electronic circuit, an RF signal power amplifier circuit, and an integrated circuit for combining two radio frequency signals. The electronic circuit includes a first input electrically coupled to a first node and ground. A second input is electrically coupled to a second node and ground. At least one resistor is electrically coupled to the first node and the second node. A first capacitor is electrically coupled to the first node and ground. A second capacitor is electrically coupled to a third node and ground. A first inductor is electrically coupled to the first node and the third node. A third capacitor is electrically coupled to the second node and ground. A fourth capacitor is electrically coupled to a fourth node and ground. A second inductor is electrically coupled to the second node and the fourth node. A fifth capacitor is situated in parallel with the first capacitor and the first inductor. The fifth capacitor is electrically coupled to the first node and the third node. A sixth capacitor situated in parallel with the third capacitor and the second inductor. The sixth capacitor is electrically coupled to second node and the fourth node. A third inductor is electrically coupled to the third node and the fourth node. A seventh capacitor electrically coupled to the third terminal and an output. An eighth capacitor electrically coupled to the fourth node and the output.

In another embodiment, a Radio Frequency ("RF") signal power amplifier circuit is disclosed. The RF signal power amplifier circuit includes a signal power amplification subcircuit having a first input and an RF combiner circuit. The RF combiner circuit comprises a first input electrically coupled to a first node and ground. A second input is electrically coupled to a second node and ground. At least one resistor is electrically coupled to the first node and the second node. A first capacitor is electrically coupled to the first node and ground. A second capacitor is electrically coupled to a third node and ground. A first inductor is electrically coupled to the first node and the third node. A third capacitor is electrically coupled to the second node and ground. A fourth capacitor is electrically coupled to a fourth node and ground. A second inductor is electrically coupled to the second node and the fourth node. A fifth capacitor is situated in parallel with the first capacitor and the first inductor. The fifth capacitor is electrically coupled to the first node and the third node. A sixth capacitor situated in parallel with the third capacitor and the second inductor. The sixth capacitor is electrically coupled to second node and the fourth node. A third inductor is electrically coupled to the third node and the fourth node. A seventh capacitor electrically coupled to the third terminal and an output. An eighth capacitor electrically coupled to the fourth node and the output.

In yet another embodiment, an integrated circuit is disclosed. The integrated circuit includes a circuit supporting substrate and an electronic circuit disposed on the circuit supporting substrate. The electronic circuit includes a first input electrically coupled to a first node and ground. A second input is electrically coupled to a second node and ground. At least one resistor is electrically coupled to the first node and the second node. A first capacitor is electrically coupled to the first node and ground. A second capacitor is electrically coupled to a third node and ground. A first inductor is electrically coupled to the first node and the third node. A third capacitor is electrically coupled to the second node and ground. A fourth capacitor is electrically coupled to a fourth node and ground. A second inductor is electrically coupled to the second node and the fourth node. A fifth capacitor is situated in parallel with the first capacitor and the first inductor. The fifth capacitor is electrically coupled to the first node and the third node. A sixth capacitor situated in parallel with the third capacitor and the second inductor. The sixth capacitor is electrically coupled to second node and the fourth node. A third inductor is electrically coupled to the third node and the fourth node. A seventh capacitor electrically coupled to the third terminal and an output. An eighth capacitor electrically coupled to the fourth node and the output.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention.

DETAILED DESCRIPTION

As required, detailed embodiments of the present invention are disclosed herein; however, it is to be understood that the disclosed embodiments are merely examples of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

An advantage of the foregoing embodiments of the present invention is that it provides an elliptic section that simultaneously allows for filtering and reduction in required values for components of the RF combiner. For example, the filtering provided by the RF combiner of one embodiment allows for the harmonic of the combining frequency to be filtered out. This allows a designer to compensate for additional loss experienced by the circuit by reducing filtering from sections that follow the circuit. Another advantage of various embodiments of the present invention is that two RF signals can be combined at VHF with realizable components. Yet another advantage of various embodiments is that they allow a designer to fine tune performance based on the requirements of surrounding circuitry. Certain embodiments of the present invention also improve input return loss over conventional RF combiners such as the conventional RF combiner 100 discussed below.

Conventional VHF Combiner

Figure 1:
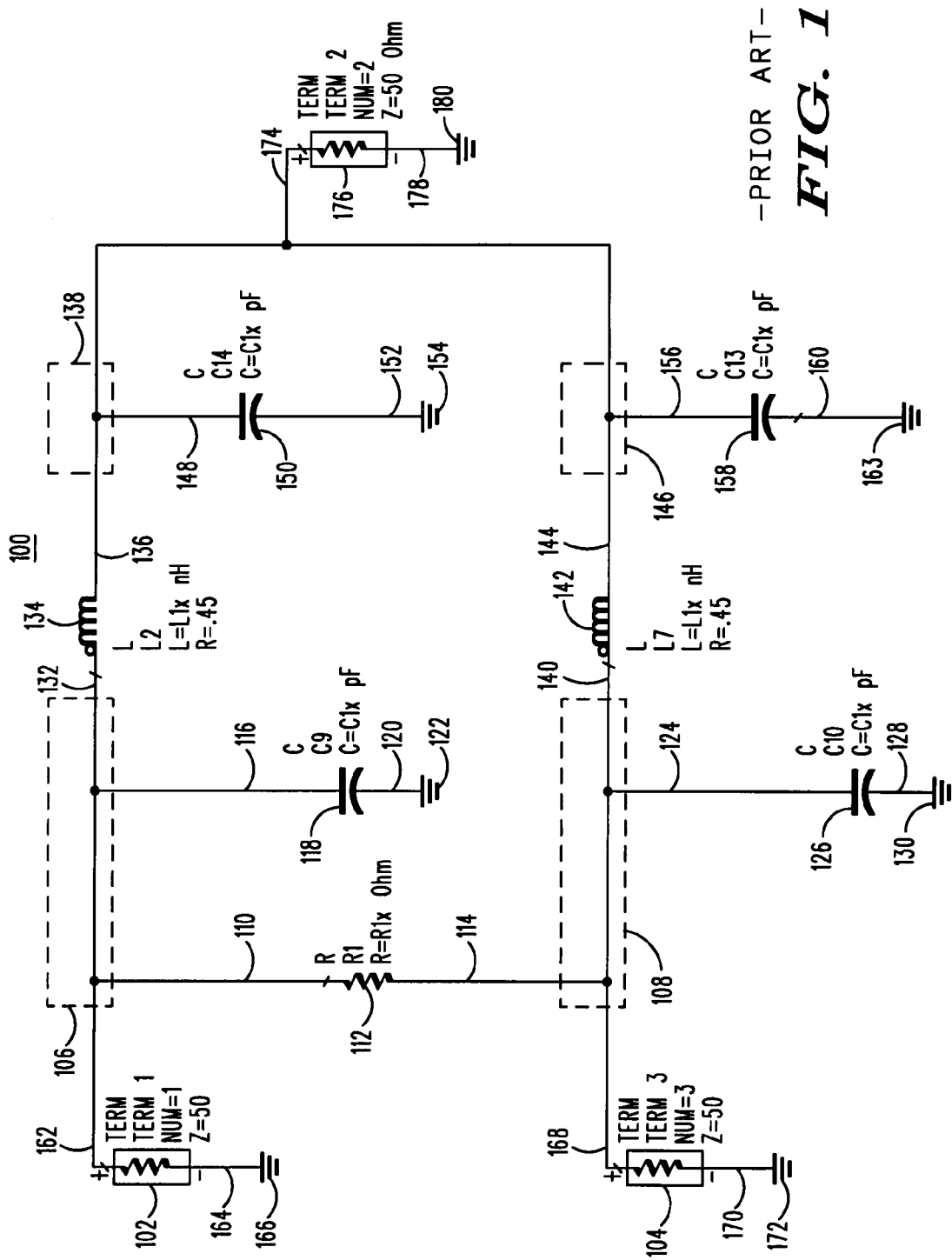
FIG. 1 is a schematic illustrating a conventional RF combiner.

FIG. 1 illustrates a conventional Very High Frequency ("VHF") combiner 100 that combines two inputs into a single output. The conventional VHF combiner 100 comprises a first input 102 and a second input 104. A first terminal 162 of the first input is electrically coupled to a first node 106. A second terminal 164 of the first input 102 is electrically coupled to ground 166. A first terminal 168 of the second input 104 is electrically coupled to a second node 108. A second terminal 168 of the second input 104 is electrically coupled to ground 172. A first terminal 110 of a first resistor 112 is electrically coupled to the first node 106 and a second terminal 114 of the first resistor 112 is electrically coupled to the second node 108. A first terminal 116 of a first capacitor 118 is electrically coupled to the first node 106. A second terminal 120 of the first capacitor 118 is electrically coupled to ground 122.

A first terminal 124 of a second capacitor 126 is electrically coupled to the second node 108. A second terminal 128 of the second capacitor 126 is electrically coupled to ground 130. A first terminal 132 of a first inductor 134 is electrically coupled to the first node 106. A second terminal 136 of the first inductor 134 is electrically coupled to a third node 138. A first terminal 140 of a second inductor 142 is electrically coupled to the second node 108. A second terminal 144 of the second inductor 142 is electrically coupled to a fourth node 146. A first terminal 148 of a third capacitor 150 is electrically coupled to the third node 138.

A second terminal 152 of the third capacitor 150 is electrically coupled to ground 154. A first terminal 156 of a fourth capacitor 158 is electrically coupled to the fourth node 146. A second terminal 160 of the fourth capacitor is electrically coupled to ground 162. A first terminal 174 of an output 176 is electrically coupled to the third node 138 and the fourth node 146. A second terminal of the output 176 is electrically coupled to ground 180.

One problem with the above conventional VHF combiner 100 is that it requires values for its components that are too large to be effectively implemented within modern wireless communication system components. In particular, the inductance required in the conventional VHF combiner 100 is large and results in high losses in the circuit. The conventional combiner requires inductor 134 and inductor 132 to be 75 nH for the circuit to be centered at 155 MHz. All capacitors 118, 150, 126, and 158 are required to be 15 pF and resistor 112 is 100 ohms.

Filtering Radio Frequency Combiner

Figure 2:
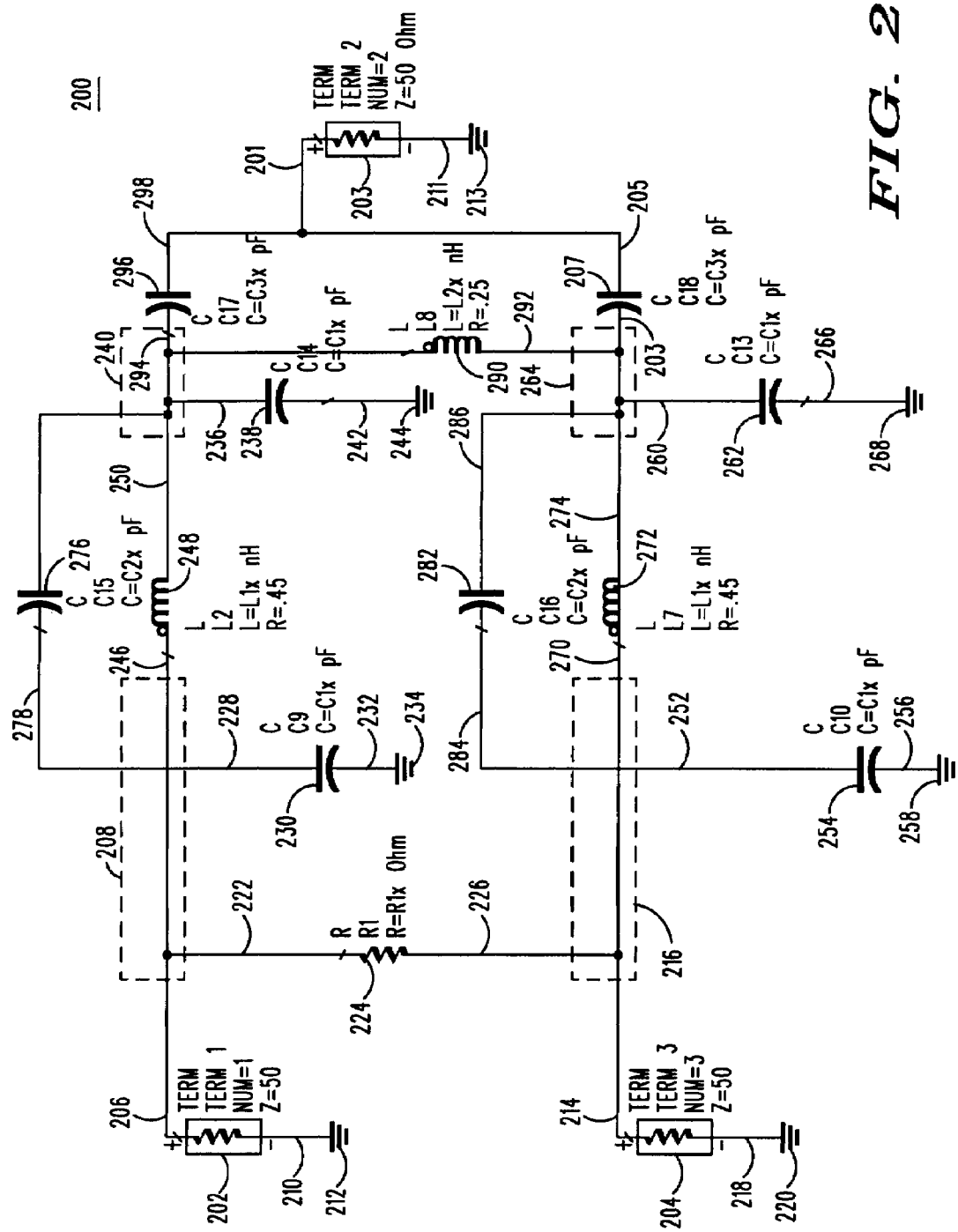
FIG. 2 is a schematic illustrating an RF combiner according to an embodiment of the present invention.

According to one embodiment of the present invention, as shown in FIG. 2, a novel radio frequency ("RF") combiner 200 is illustrated. It should be noted that the RF combiner 200 is able to combine RF signals at both VHF and Ultra High Frequencies ("UHF"). However, the following discussion illustrates an example using VHF. In one embodiment, the RF combiner 200 is a discrete RF combiner and can be implemented in a power amplifier. Such a power amplifier can be an RF signal power amplifier that includes a signal power amplification sub-circuit having a first input (not shown) and the output of the RF combiner circuit 200 is electrically coupled to the input of the signal power amplification sub-circuit. In this way, a plurality of RF signals can be electrically combined and amplified for use in many different applications.

The RF combiner 200 comprises a first input 202 and a second input 204 that receive signals at VHF (i.e., between 30 MHz and 300 MHz). A first terminal 206 of the first input is electrically coupled to a first node 208. A second terminal 210 of the first input 202 is electrically coupled to ground 212. A first terminal 214 of the second input 204 is electrically coupled to a second node 216. A second terminal 218 of the second input 204 is electrically coupled to ground 220. A first terminal 222 of a first resistor 224 is electrically coupled to the first node 208 and a second terminal 226 of the first resistor 224 is electrically coupled to the second node 216. A first terminal 228 of a first capacitor 230 is electrically coupled to the first node 208. A second terminal 232 of the first capacitor 230 is electrically coupled to ground 234.

A first terminal 236 of a second capacitor 238 is electrically coupled to a third node 240. A second terminal 242 of the second capacitor 238 is electrically coupled to ground 244. A first terminal 246 of a first inductor 248 is electrically coupled to the first node 208. A second terminal 250 of the first inductor 248 is electrically coupled to the third node 240. A first terminal 252 of a third capacitor 254 is electrically coupled to the second node 216. A second terminal 256 of the third capacitor 254 is electrically coupled to ground 258. A first terminal 260 of a fourth capacitor 262 is electrically coupled to a fourth node 264. A second terminal 266 of the fourth capacitor 262 is electrically coupled to ground 268. A first terminal 270 of a second inductor 272 is electrically coupled to the second node 216. A second terminal 274 of the second inductor 272 is electrically coupled to the fourth node 264.

A fifth capacitor 276 is electrically coupled in parallel with the first inductor 248. Specifically, a first terminal 278 of the fifth capacitor 276 is electrically coupled to the first node 208, and a second terminal 280 of the fifth capacitor 276 is electrically coupled to the third node 240.

A sixth capacitor 282 is electrically coupled in parallel with the second inductor 272. Specifically, a first terminal 284 of the sixth capacitor 282 is electrically coupled to the second node 216, and a second terminal 286 of the fifth capacitor 282 is electrically coupled to the fourth node 264.

A first terminal 288 of a third inductor 290 is electrically coupled to the third node 240. A second terminal 292 of the third inductor 290 is electrically coupled to the fourth node 264.

A first terminal 294 of a seventh capacitor 296 is electrically coupled to the third node 240. A second terminal 298 of the seventh capacitor 296 is electrically coupled to a first terminal 201 of an output 203.

A first terminal 205 of an eighth capacitor 207 is electrically coupled to the fourth node 264. A second terminal 209 of the eighth capacitor 207 is electrically coupled to the first terminal 201 of the output 203. A second terminal 211 of the output 203 is electrically coupled to ground 213.

One of the advantages of the above configuration is that the fifth and sixth capacitors 276, 282 provide an elliptic section that simultaneously allows for filtering and reduction in required values for the first and second inductors 248, 272, respectively. For example, the filtering provided by the fifth and sixth capacitors 276, 282 allows for the harmonic of the combining frequency to be filtered out. This allows a designer to compensate for additional loss experienced by the circuit 200 by reducing filtering from sections that follow the circuit 200.

Another advantage of the present invention is that the above configuration allows two RF signals to be combined at VHF with realizable components. According to one example, the fifth and sixth capacitors 276, 282 allow the first and second inductors 248, 272 to be approximately 51 nH or 52 nH. It should be noted that the selection of the fifth and sixth capacitors 276, 282 depends on the frequencies to be rejected or the filter portion of the combiner. The conventional RF combiner, on the other hand, typically requires inductors between the range of 62 nH to 87 nH to be used.

Yet another advantage is that the seventh capacitor 296 and the eighth capacitor 207 comprise a tuning circuit. This tuning circuit provides a designer the ability to fine tune performance based on the requirements of surrounding circuitry. Additionally, the third inductor 290 improves input return loss over conventional RF combiners such as the conventional RF combiner 100 discussed above.

Figure 3:
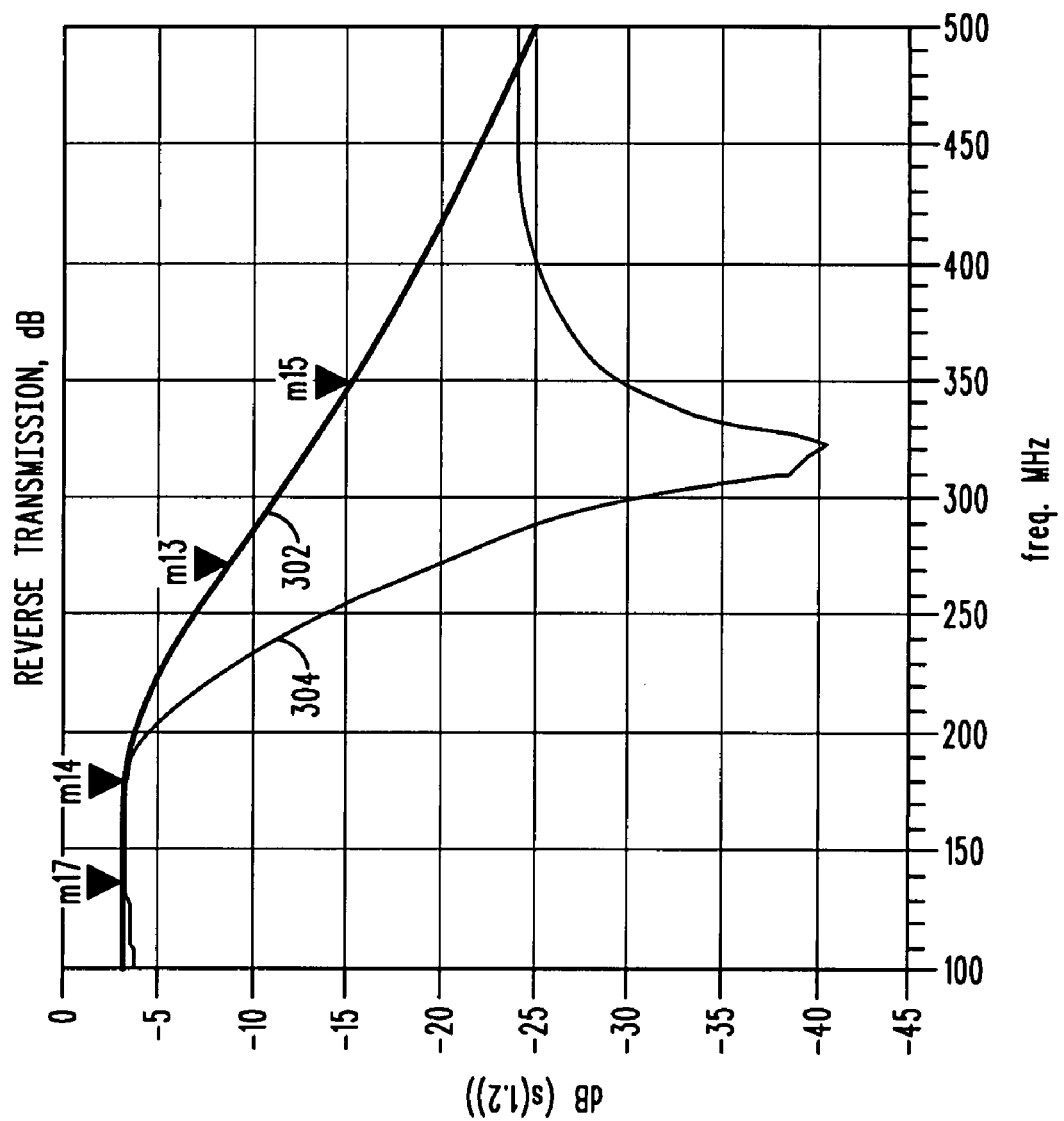
FIG. 3 is a graph illustrating the filtering capabilities of the RF combiner of FIG. 2 according to an embodiment of the present invention.
Figure 4:
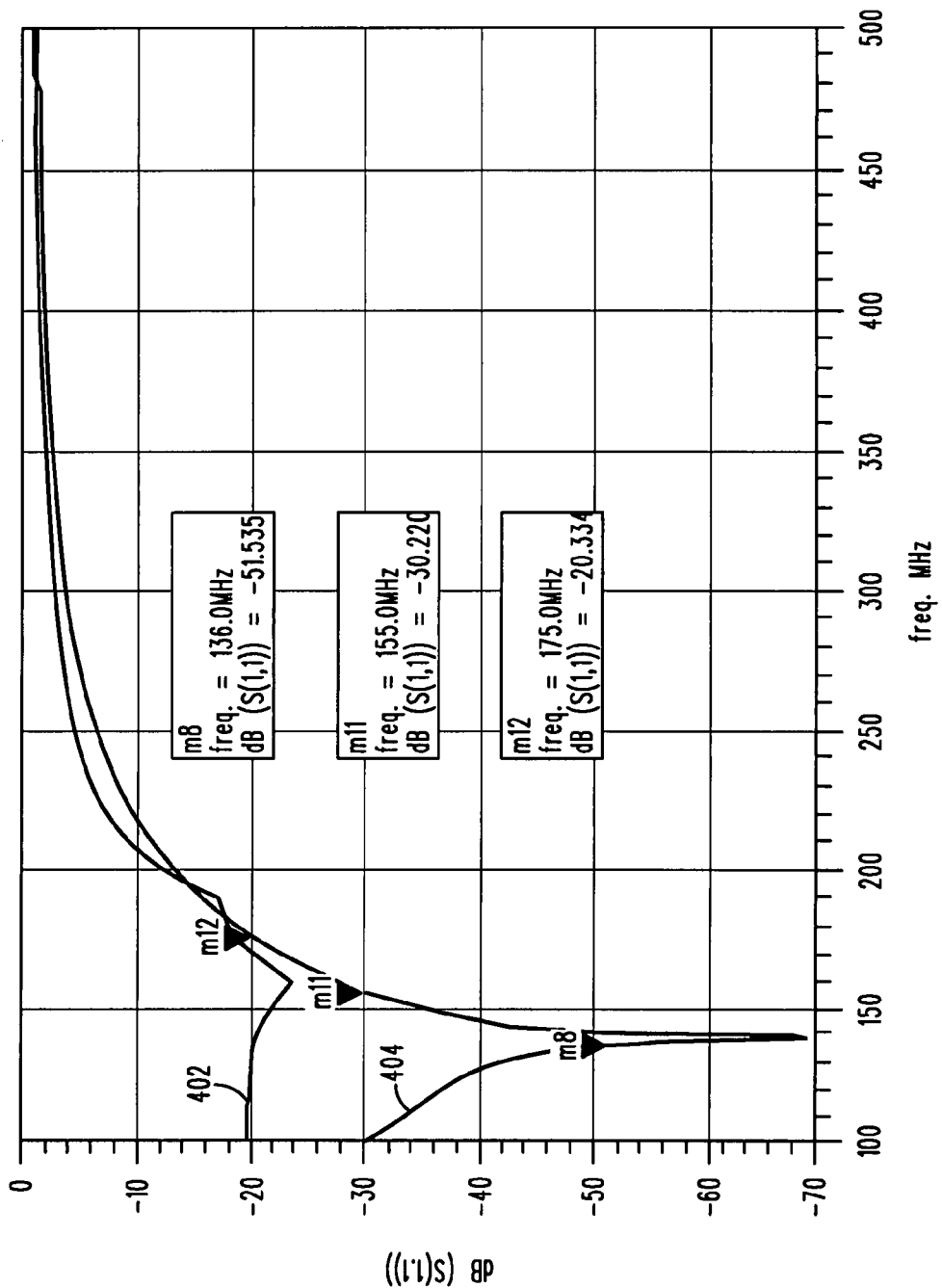
FIG. 4 is a graph illustrating the improved return-loss of the RF combiner of FIG. 2 according to an embodiment of the present invention.

FIG. 3 and FIG. 4 are graphs illustrating a few of the advantages of the example of the present invention discussed above over conventional RF combiners. FIG. 3 shows a first trace 302 representing the conventional RF combiner 100 of FIG. 1. A second trace 304 represents the RF combiner 200 of FIG. 2, according to one embodiment of the present invention. As can be seen, the conventional RF combiner 100 does not provide any filtering, wherein the RF combiner 200 of the present invention does. For example, with the RF combiner 200 of the present invention, if one signal at approximately 120 MHz and another signal at approximately 170 MHz are combined, the RF combiner 200 according to the present example allows for signals between 270 MHz and 350 MHz to be filtered out, as shown in FIG. 3.

FIG. 4 illustrates the better return loss experienced by the novel RF combiner 200 as compared to a conventional RF combiner 100. FIG. 4 illustrates a first trace 402 representing the conventional RF combiner 100 and a second trace 404 representing the novel RF combiner 200. As can be seen from FIG. 4, the novel RF combiner 200 allows for better matching to the circuit and reduced loss.

Non-Limiting Examples

Although specific embodiments of the invention have been disclosed, those having ordinary skill in the art will understand that changes can be made to the specific embodiments without departing from the spirit and scope of the invention. For example, and not for any limitation, the RF combiner circuit 200 can be implemented as part of a power amplifier circuit. Further, the RF combiner circuit 200 can be implemented in an integrated circuit with the RF combiner circuit 200 being disposed on a circuit supporting substrate. This integrated circuit construction allows the RF combiner circuit 200 to be readily used in many different applications and can also be incorporated into many different types of modern wireless communication system components. Applications for this circuit include, but are not limited to, splitting and/or combining RF signals at VHF, combining power from two independent amplifiers, providing filtering while simultaneously combining signals. The scope of the invention is not to be restricted, therefore, to the specific embodiments, and it is intended that the appended claims cover any and all such applications, modifications, and embodiments within the scope of the present invention.

What is claimed is:

1. An electronic circuit for combining two radio frequency signals, the electronic circuit comprising:

a first input comprising first and second terminals being electrically coupled to a first node and the ground, respectively;

a second input comprising first and second terminals being electrically coupled to a second node and the ground, respectively;

a resistor comprising first and second terminals being electrically coupled to the first node and the second node, respectively;

a first capacitor comprising first and second terminals being electrically coupled to the first node and the ground, respectively;

a second capacitor comprising first and second terminals being electrically coupled to a third node and the ground, respectively;

a first inductor comprising first and second terminals being electrically coupled to the first node and the third node, respectively;

a third capacitor comprising first and second terminals being electrically coupled to the second node and the ground, respectively;

a fourth capacitor comprising first and second terminals being electrically coupled to a fourth node and the ground, respectively;

a second inductor comprising first and second terminals being electrically coupled to the second node and the fourth node, respectively;

a fifth capacitor electrically coupled in parallel with the first inductor, wherein the fifth capacitor comprising first and second terminals being electrically coupled to the first node and the third node, respectively;

a sixth capacitor electrically coupled in parallel with the second inductor, wherein the sixth capacitor comprising first and second terminals being electrically coupled to the second node and the fourth node, respectively;

a third inductor comprising first and second terminals being electrically coupled to the third node and the fourth node, respectively;

a seventh capacitor comprising first and second terminals being electrically coupled to the third node and a first terminal of an output, respectively; and an eighth capacitor comprising first and second terminals being electrically coupled to the fourth node and the first terminal of the output.

2. The electronic circuit of claim 1, wherein the fifth capacitor and the sixth capacitor allow for the first inductor and second inductor to comprise a value of substantially 52 nH.

3. The electronic circuit of claim 1, wherein the fifth capacitor and the sixth capacitor comprise at least part of a filtering circuit that filters out a harmonic of a frequency being combined.

4. The electronic circuit of claim 1, wherein the seventh capacitor and the eighth capacitor comprise at least part of a tuning circuit.

5. The electronic circuit of claim 1, wherein the third inductor improves experienced return-loss at the output.

6. The electronic circuit of claim 1, wherein the electronic circuit for combining two radio frequency signals is designed and constructed for operating as a radio frequency signal combiner with the first input and the second input each receiving a signal substantially between 30 MHz and 300 Mhz.

7. The electronic circuit of claim 1, wherein the electronic circuit for combining two radio frequency signals is designed and constructed for operating as a radio frequency signal combiner with the first input and the second input each receiving a signal substantially between 300 MHz and 3 GHz.

8. A radio frequency ("RF") signal power amplifier circuit comprising: an RF signal combiner circuit, including: a first input comprising first and second terminals being electrically coupled to a first node and the ground, respectively; a second input comprising first and second terminals being electrically coupled to a second node and the ground, respectively; a resistor comprising first and second terminals being electrically coupled to the first node and the second node, respectively; a first capacitor comprising first and second terminals being electrically coupled to the first node and the ground, respectively; a second capacitor comprising first and second terminals being electrically coupled to a third node and the ground, respectively; a first inductor comprising first and second terminals being electrically coupled to the first node and the third node, respectively; a third capacitor comprising first and second terminals being electrically coupled to the second node and the ground, respectively; a fourth capacitor comprising first and second terminals being electrically coupled to a fourth node and the ground, respectively; a second inductor comprising first and second terminals being electrically coupled to the second node and the fourth node, respectively; a fifth capacitor electrically coupled in parallel with the first inductor, wherein the fifth capacitor comprising first and second terminals being electrically coupled to the first node and the third node, respectively; a sixth capacitor electrically coupled in parallel with the second inductor, wherein the sixth capacitor comprising first and second terminals being electrically coupled to the second node and the fourth node, respectively; a third inductor comprising first and second terminals being electrically coupled to the third node and the fourth node, respectively; a seventh capacitor comprising first and second terminals being electrically coupled to the third node and a first terminal of an output, respectively; and an eighth capacitor comprising first and second terminals being electrically coupled to the fourth node and the first terminal of the output.

9. The RF signal power amplifier circuit of claim 8, wherein the fifth capacitor and the sixth capacitor comprise at least part of a filtering circuit that filters out a harmonic of a frequency of signals being combined.

10. The RF signal power amplifier circuit of claim 8, wherein the seventh capacitor and the eighth capacitor comprise at least part of a tuning circuit.

11. The RF signal power amplifier circuit of claim 8, wherein the third inductor improves experienced return-loss at the first terminal of the output.

12. The RF signal power amplifier circuit of claim 8, wherein the RF signal combiner circuit is designed and constructed for operating as a radio frequency signal combiner with the first input and the second input each receiving a signal between 30 MHz and 300 Mhz.

13. The RF signal power amplifier circuit of claim 8, wherein the RF signal combiner circuit is designed and constructed for operating as a radio frequency signal combiner with the first input and the second input each receiving a signal between 300 MHz and 3 GHz.

14. An integrated circuit including at least one radio frequency signal combiner, the integrated circuit comprising:
at least one electronic circuit including:
a first input comprising first and second terminals being electrically coupled to a first node and the ground, respectively;
a second input comprising first and second terminals being electrically coupled to a second node and the ground, respectively;
a resistor comprising first and second terminals being electrically coupled to the first node and the second node, respectively;
a first capacitor comprising first and second terminals being electrically coupled to the first node and the ground, respectively;
a second capacitor comprising first and second terminals being electrically coupled to a third node and the ground, respectively;
a first inductor comprising first and second terminals being electrically coupled to the first node and the third node, respectively;
a third capacitor comprising first and second terminals being electrically coupled to the second node and the ground, respectively;
a fourth capacitor comprising first and second terminals being electrically coupled to a fourth node and the ground, respectively;
a second inductor comprising first and second terminals being electrically coupled to the second node and the fourth node, respectively;
a fifth capacitor electrically coupled in parallel with the first inductor, wherein the fifth capacitor comprising first and second terminals being electrically coupled to the first node and the third node, respectively;
a sixth capacitor electrically coupled in parallel with the second inductor, wherein the sixth capacitor comprising first and second terminals being electrically coupled to the second node and the fourth node, respectively;
a third inductor comprising first and second terminals being electrically coupled to the third node and the fourth node, respectively;
a seventh capacitor comprising first and second terminals being electrically coupled to the third node and a first terminal of an output, respectively; and
an eighth capacitor comprising first and second terminals being electrically coupled to the fourth node and the first terminal of the output.

15. The integrated circuit of claim 14, wherein the fifth capacitor and the sixth capacitor comprise at least part of a filtering circuit that filters out a harmonic of a frequency of signals being combined.

16. The integrated circuit of claim 14, wherein the seventh capacitor and the eighth capacitor comprise at least part of a tuning circuit.

17. The integrated circuit of claim 14, wherein the third inductor improves experienced return-loss at the first terminal of the output.

18. The integrated circuit of claim 14, wherein the at least one electronic circuit is designed and constructed for operating as at least one radio frequency signal combiner with the first input and the second input each receiving a signal between 30 MHz and 300 Mhz.

19. The integrated circuit of claim 14, wherein the at least one electronic circuit is designed and constructed for operating as at least one radio frequency signal combiner with the first input and the second input each receiving a signal between 300 MHz and 3 GHz.

20. The integrated circuit of claim 14, wherein the fifth capacitor and the sixth capacitor allow for each of the first inductor and the second inductor to comprise a value of substantially 52 nH.

* * * * *